SOLAR POWERED PORTABLE RADIO RECEIVER OR THE LIKE

Filed Feb. 3, 1956

MAURICE E. PARADISE
INVENTOR.
BY [signature]
HIS ATTORNEY

United States Patent Office 2,919,353

Patented Dec. 29, 1959

2,919,353

SOLAR POWERED PORTABLE RADIO RECEIVER OR THE LIKE

Maurice E. Paradise, Highland Park, Ill., assignor to Hoffman Electronics Corporation, a corporation of California Application February 3, 1956, Serial No. 563,267

4 Claims. (Cl. 250—239)

This invention is related to portable radio receivers, the power supply batteries of which are charged from a plurality of series-connected, photovoltaic devices, and more particularly to a new and improved portable radio receiver of the type described in which the aforementioned photovoltaic devices may be oriented selectively for maximum photon impingement from the sun or other light source thereupon without necessitating disturbance of the primary disposition of the radio receiver itself.

Of recent date there has been devised, to the inventor's knowledge, at least one portable radio receiver employing transistors as translating stages in which a plurality of series-coupled photovoltaic devices have been utilized to charge the operating battery of the receiver. It is of course obvious that if these photovoltaic devices are affixed to the receiver in one particular disposition that the radio receiver itself would have to be positioned so as to accommodate maximum photon impingement upon such photovoltaic devices, and, hence, to obtain maximum power output therefrom. It has occurred to the invention that if the photovoltaic devices were themselves adapted for selective positioning so as to obtain maximum exposure to incident light rays, the radio receiver or other operating unit may be left fixed in an optimum position.

Therefore, it is an object of the present invention to provide for a new electrical apparatus employing a plurality of photovoltaic devices themselves selectively orientable so that maximum exposure of such devices to a light source may be obtained independently of the positioning of the electrical apparatus itself.

It is a further object of the present invention to provide a new and useful transistorized radio receiver having a plastic handle which encases a plurality of interconnected photovoltaic devices, the plastic handle being adapted for selective positioning thereof to attain maximum exposure of said photovoltaic devices to incident light rays for all dispositions of the sun or other light emitting source relative to the radio receiver.

According to one embodiment of the present invention, a radio receiver having a power requirement of 3 volts at 30 milliamperes employs, necessarily, transistors as translating devices, a storage battery, and a plurality of interconnected photovoltaic devices which may be selectably oriented in the direction of the light source for maximum photon impingement thereupon, and this without necessitating the redeployment of the radio receiver. The photovoltaic devices are preferably mounted in a novel carrying handle construction which by reason of its structure permits handle adjustment so as to provide for maximum photon impingement upon the photovoltaic devices employed.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
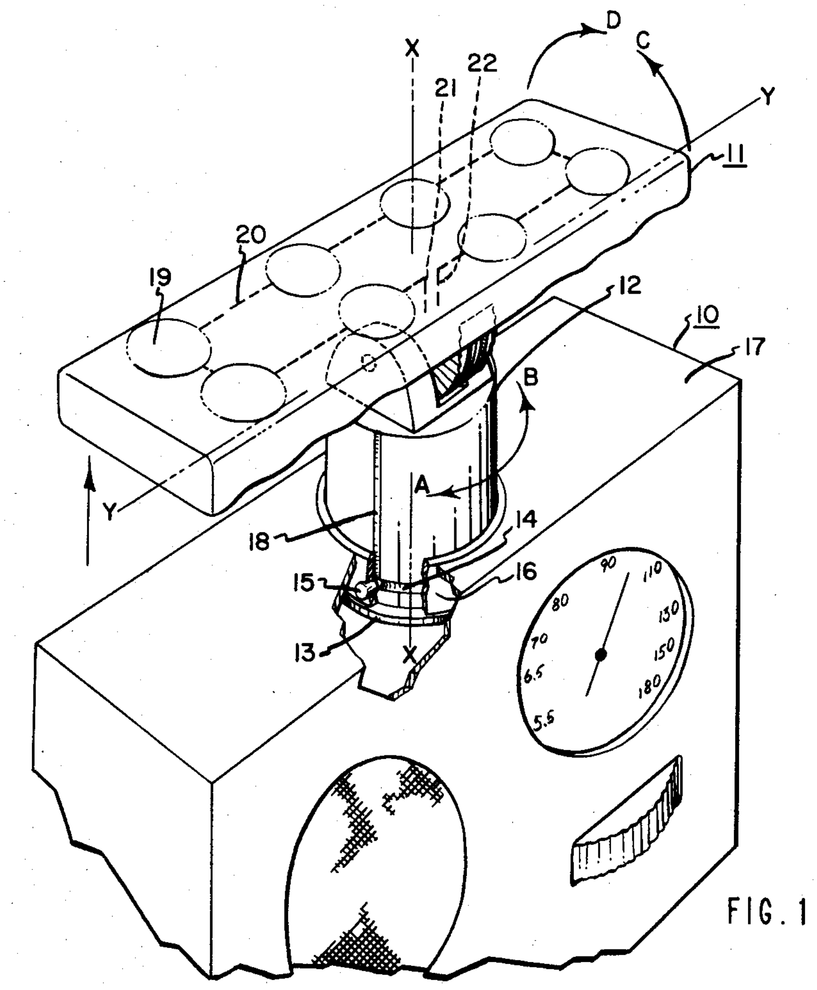
Figure 1 is a front perspective view of a portable radio receiver according to the present invention.

In Figure 1, radio receiver 10 is provided with handle member 11 and vertically displaceable shaft 12. Shaft 12 is provided with flared base portion 13 and annular groove 14 which cooperates with spring biased pin 15 mounted to collar 16 of receiver enclosure 17. It is apparent from Figure 1 that shaft 12 may be rotated about its axis 360° either in direction A or in direction B, thus enabling the repositioning of handle member 11 from 0 to 360°. The cooperation of annular groove 14 and spring biased pin 15 provides for the retention of shaft 12 in its upright and extended condition; if desired, one may lower shaft 12 into the receiver by means of supplying slight downward pressure upon handle 11 so as to overcome the friction between pin 15 and shaft 12. Also, vertical, axially aligned groove 18 may be supplied in the wall of shaft 12 to cooperate with pin 15 so as to maintain handle member 11 in congruous relationship with the top configuration of receiver 10 when handle member 11 is resting upon receiver 10.

Within handle member 11 itself are encased a plurality of interconnected photovoltaic devices 19, conventionally known as solar cells. These devices may for example be embedded in handle member 11 which may conveniently be manufactured from a plastic material having a low coefficient of light absorption. Or, as an alternative, circular depressions may be provided in handle member 11 to accommodate the direct placement of the photovoltaic devices therewithin, with grooves being provided at the bottom to accommodate electrical connection by a plurality of wire leads 20. End terminals 21 and 22 of interconnecting wire leads 20 may be electrically joined, for example, to conductive ribbons 200 and 201 which are disposed upon plastic protrusion 202 of handle member 11. This is shown in Figure 2.

Figure 2:
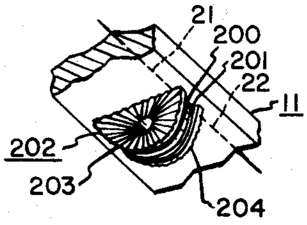
Figure 2 is a perspective view of a portion of the handle assembly according to the present invention.
Figure 3:
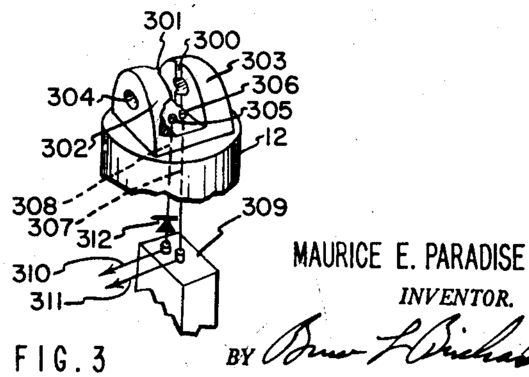
Figure 3 is a perspective view of a portion of the handle assembly of a radio receiver according to the present invention, showing with particularity (in conjunction with Figure 2) the manner and means by which electrical contact is made with the receiver battery and circuitry.

In Figure 2, in addition to being provided with conductive ribbons 200 and 201, protrusion 202 also includes faces 203 and 204 which are provided with radial corrugations to cooperate with retainer portions 300 and 301 in Figure 3. Retainer portions 300 and 301 are located upon the interior surfaces of end portions 302 and 303 of shaft 12, as is shown in Figure 3.

In Figure 3 there is also shown a pivot means aperture 304 extending through end portions 302 and 303. Electrical contacts 305 and 306 may comprise either wiper contacts, buttons, or brushes, and are adapted to cooperate with ribbons 200 and 201 of Figure 2. Contacts 305 and 306 are provided with wire leads 307 and 308 which may be routed to the terminals of the receiver power supply battery 309. Leads 310 and 311 are coupled to the battery terminals and are routed to the receiver circuitry. If desired, diode 312 may be included between one of the contacts 305 and 306 and battery 309 so as to prevent a discharge of the receiver battery through the solar cells during time intervals of reduced illumination.

From a study of Figures 1 through 3 and the discussion relating thereto, it is seen that substantial omnidirectivity of the handle member 11 is achieved so that the operator may face the solar cells in the direction of the sun or other photon emitter without having to reorient the receiver proper. By means of the cooperation of groove 14 and spring biased pin 15, the operator may rotate handle member 11 about axis X—X in either the A direction or the B direction shaft 12. Rotational displacement of handle member 11 about axis Y—Y in either the C direction or the D direction is accomplished through the inter-cooperation of the radially corrugated surfaces shown in Figure 2 with the retainer protrusions 300 and 301 shown in Figure 3. Whatever particular disposition of the handle is chosen will be preserved until the next disposition is selected by the operator.

Representative of the photovoltaic or solar cell devices which may be employed in the present invention are the photosensitive devices described in co-pending applications, Serial No. 536,489, filed September 26, 1955, and entitled "Photosensitive Device and Method of Making the Same," and Serial No. 541,169, filed October 18, 1955, now Patent No. 2,862,160, and entitled "Light Sensitive Device and Method of Making the Same."

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

I claim:

1. In a solar-energy powered portable radio receiving set, in combination, a receiver enclosure housing having an elongated upper wall surface, and a combined retractable carrying handle and solar-energy converting unit, said unit being disposed above said housing and of relatively flat elongated shape and having a plurality of photovoltaic energy conversion devices carried by said unit at a flat surface thereof facing generally upwards away from said housing, and conductors extending from said devices into said housing for connection to radio equipment therein; a cylindrical post slidably mounted in said housing for retractable extension from its said upper wall surface, and a pivotal connection between the free end of said post and the underside of said unit, the pivot axis of said connection lying generally parallel to the lengthwise dimension of said unit.

2. In a solar-energy powered portable radio receiving set, in combination, a receiver enclosure housing having an elongated upper wall surface, and a combined retractable carrying handle and solar-energy converting unit, said unit being disposed above said housing and of relatively elongated shape and having a plurality of photovoltaic energy conversion devices carried by said unit at a surface thereof facing generally upwards away from said housing, and conductors extending from said devices into said housing for connection to radio equipment therein; means connecting said unit with said housing for bodily movement of the former a limited distance away from the latter, and means pivotally mounting said unit relative to said housing upon an axis lying generally parallel to the long dimension of said unit and between said unit and said housing; said conductors including arcuate sliding contact elements disposed concentric to said axis.

3. In a solar-energy powered portable radio receiving set, in combination, a receiver enclosure housing having an elongated upper wall surface, and a combined retractable carrying handle and solar-energy converting unit, said unit being disposed above said housing and of relatively elongated shape and having a plurality of photovoltaic energy conversion devices carried by said unit at a surface thereof facing generally upwards away from said housing, and conductors extending from said devices into said housing for connection to radio equipment therein; means connecting said unit with said housing for bodily movement of the former a limited distance away from the latter, and means pivotally mounting said unit relative to said housing upon an axis lying generally parallel to the long dimension of said unit and between said unit and said housing; said pivotally mounting means comprising detent formations to maintain the parts in adjusted position.

4. In a solar-energy powered portable radio receiving set, in combination, a receiver enclosure housing having an elongated upper wall surface, and a combined retractable carrying handle and solar-energy converting unit, said unit being disposed above said housing and of relatively elongated shape and having a plurality of photovoltaic energy conversion devices carried by said unit at a surface thereof facing generally upwards away from said housing, and conductors extending from said devices into said housing, for connection to radio equipment therein; means connecting said unit with said housing for bodily movement of the former a limited distance away from the latter, means pivotally mounting said unit relative to said housing upon an axis lying generally parallel to the long dimension of said unit and between said unit and said housing; and further means pivotally mounting said unit for rotation about an axis perpendicular to the upper wall surface of said housing.

References Cited in the file of this patent

UNITED STATES PATENTS

| | | |
|---|---|---|
| 755,669 | Hutchison | Mar. 29, 1904 |
| 1,683,270 | Taylor et al. | Sept. 4, 1928 |
| 1,725,329 | Blandford | Aug. 20, 1929 |
| 1,993,070 | Middleton | Mar. 5, 1935 |
| 2,000,642 | Lamb | May 7, 1935 |
| 2,145,147 | Wolferz | Jan. 24, 1939 |
| 2,280,465 | Barrett et al. | Apr. 21, 1942 |
| 2,323,473 | Korling | July 6, 1943 |
| 2,336,104 | Laube et al. | Dec. 7, 1943 |
| 2,480,405 | Findley | Aug. 30, 1949 |
| 2,502,667 | Pagett | Apr. 4, 1950 |
| 2,671,623 | Toulmin | Mar. 9, 1954 |
| 2,762,932 | Falge et al. | Sept. 11, 1956 |
| 2,776,364 | Daniels | Jan. 1, 1957 |
| 2,780,765 | Chapin et al. | Feb. 5, 1957 |

OTHER REFERENCES

National Geographic, July 1954, page 117.

Hollman: Elektro-Technik, Wurzburg; Oct. 9, 1954; vol. 41; Issue F10; pp. 85–87.

Hollman: "Designing Free-Power Transistor Apparatus," Teletack and Electronic Industries, August 1956, pages 66, 67, 150, 151, 152, 153, and 154.